United States Patent
Barnes et al.

(10) Patent No.: US 11,108,364 B1
(45) Date of Patent: Aug. 31, 2021

(54) SYSTEM AND METHOD FOR DIGITAL PRE-DISTORTION CIRCUITS

(71) Applicant: Xilinx, Inc., San Jose, CA (US)

(72) Inventors: Vincent C Barnes, El Paso, TX (US); Ponnamanda Venkata Chandra Sekhar, Hyderabad (IN); Prateek Jha, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/880,508

(22) Filed: May 21, 2020

(51) Int. Cl.
*H03F 1/32* (2006.01)
*H04B 1/04* (2006.01)

(52) U.S. Cl.
CPC ......... *H03F 1/3247* (2013.01); *H03F 1/3252* (2013.01); *H03F 1/3294* (2013.01); *H04B 1/0475* (2013.01); *H04B 2001/0425* (2013.01)

(58) Field of Classification Search
CPC .... H03F 1/3247; H03F 1/3294; H03F 1/3252; H04B 1/0475; H04B 2001/0425
See application file for complete search history.

(56) References Cited

U.S. PATENT DOCUMENTS

| | | | |
|---|---|---|---|
| 9,338,039 B1 | 5/2016 | Barnes | |
| 2005/0190857 A1* | 9/2005 | Braithwaite | H03F 1/3258 375/296 |
| 2013/0099862 A1* | 4/2013 | Yu | H03F 3/45892 330/149 |
| 2014/0072075 A1* | 3/2014 | Cai | H03F 1/3294 375/297 |
| 2016/0182100 A1* | 6/2016 | Menkhoff | H04W 72/082 375/297 |
| 2017/0077945 A1* | 3/2017 | Pagnanelli | H03M 3/50 |

* cited by examiner

*Primary Examiner* — Dac V Ha
(74) *Attorney, Agent, or Firm* — Haynes and Boone, LLP

(57) ABSTRACT

A circuit for signal classification in a digital pre-distortion (DPD) system is provided. The circuit includes a first frequency path with a positive frequency translation to generate a first power level corresponding to a signal output of the first frequency path, a second frequency path with a negative frequency translation to generate a second power level corresponding to a signal output of the second frequency path, and a third frequency path configured to filter the input signal via a high pass filter (HPF) and to generate a third power level corresponding to a signal output of the third frequency path. The circuit further includes a processing unit configured to compute frequency content metrics corresponding to the input signal based on the first power level, the second power level and the third power level for selecting a set of DPD coefficients for the DPD circuit.

20 Claims, 10 Drawing Sheets

SYSTEM AND METHOD FOR DIGITAL PRE-DISTORTION CIRCUITS

TECHNICAL FIELD

Examples of the present disclosure generally relate to integrated circuits ("ICs") and, in particular, to an embodiment related to ICs including digital pre-distortion (DPD) circuits.

BACKGROUND

A digital pre-distortion (DPD) circuit is usually operated at a radio transmitter to improve the linearity of transmitter power amplifiers. Modern DPD systems employ frequency selective non-linear filters, each configured by filter coefficients. Some existing systems configure filter coefficients for the DPD circuit based on certain properties, e.g., power and frequency, of the input signal. However, as those properties of the input signal may change, the DPD circuit configured based on prior properties of the input signal may no longer yield satisfactory performance.

Accordingly, it would be desirable to provide an improved DPD circuit with better performance.

SUMMARY

Other aspects and features will be evident from reading the following detailed description and accompanying drawings.

In view of need to configure the filter coefficients in DPD circuits to yield better pre-distortion performance, embodiments described herein provide an apparatus for signal classification in a digital pre-distortion (DPD) circuit. The apparatus includes a first frequency path configured to filter an input signal via a first half-band low pass filter (LPF) after a positive frequency translation and to generate a first power level corresponding to a signal output of the first frequency path, a second frequency path configured to filter the input signal via a second half-band LPF after a negative frequency translation and to generate a second power level corresponding to a signal output of the second frequency path, and a third frequency path configured to filter the input signal via a high pass filter (HPF) and to generate a third power level corresponding to a signal output of the third frequency path. The apparatus further includes a processing unit configured to compute frequency content metrics corresponding to the input signal based on the first power level, the second power level and the third power level for selecting a set of DPD coefficients for the DPD circuit. In some embodiments, the processing unit is configured to compute the frequency content metrics based on the input power level (e.g., based on the input signal without frequency shift).

In some implementations, the third frequency path includes a bit shifter that right shifts the input signal by one bit, the HPF serially connected to the bit shifter and configured to filter a bit shifter output, and a down sampler serially connected to the HPF and configured to down sample an HPF output.

In some implementations, the down sampler is connected to a power meter configured to estimate the third power level as an average output signal power from the down sampler.

In some implementations, the frequency content metrics include a half-band power ratio that indicates a frequency location of signal power of the input signal and a bandwidth metric that is indicative of an instantaneous bandwidth of the input power.

In some implementations, the processing unit is configured to computing the half-band power ratio based on (the first power level−the second power level)/(the first power level+the second power level).

In some implementations, the processing unit is configured to compute the bandwidth metric based on 2×the third power level/(the first power level+the second power level).

In some implementations, the half-band power ratio and the bandwidth metric jointly classify a unique carrier configuration when the input signal belongs to a set of symmetric carrier configurations.

In some implementations, the processing unit is configured to map a combination of the half-band power ratio, the bandwidth metric and an average power of the input signal to the set of DPD coefficients in a three-dimensional space.

In some implementations, the three-dimensional space contains data points representing different sets of DPD coefficients corresponding to different carrier configurations.

In some implementations, the processing unit is configured to map the average power of the input signal to a pre-defined two-dimensional distribution landscape of DPD coefficients; and map a combination of the half-band power ratio and the bandwidth metric to the set of DPD coefficients within the pre-defined two-dimensional distribution landscape of DPD coefficients.

Embodiments described herein further provide a method for signal classification in a DPD circuit. The method includes receiving an input signal. The method further includes filtering the input signal, via a first half-band LPF after a positive frequency translation at a first frequency path, and generating a first power level corresponding to a signal output of the first frequency path. The method further includes filtering the input signal, via a second half-band LPF after a negative frequency translation at a second frequency path and generating a second power level corresponding to a signal output of the second frequency path. The method further includes filtering the input signal, via a HPF at a third frequency path and generating a third power level corresponding to a signal output of the third frequency path. The method further includes computing frequency content metrics corresponding to the input signal based on the first power level, the second power level and the third power level for selecting a set of DPD coefficients for the DPD circuit.

DETAILED DESCRIPTION

Figure 1:
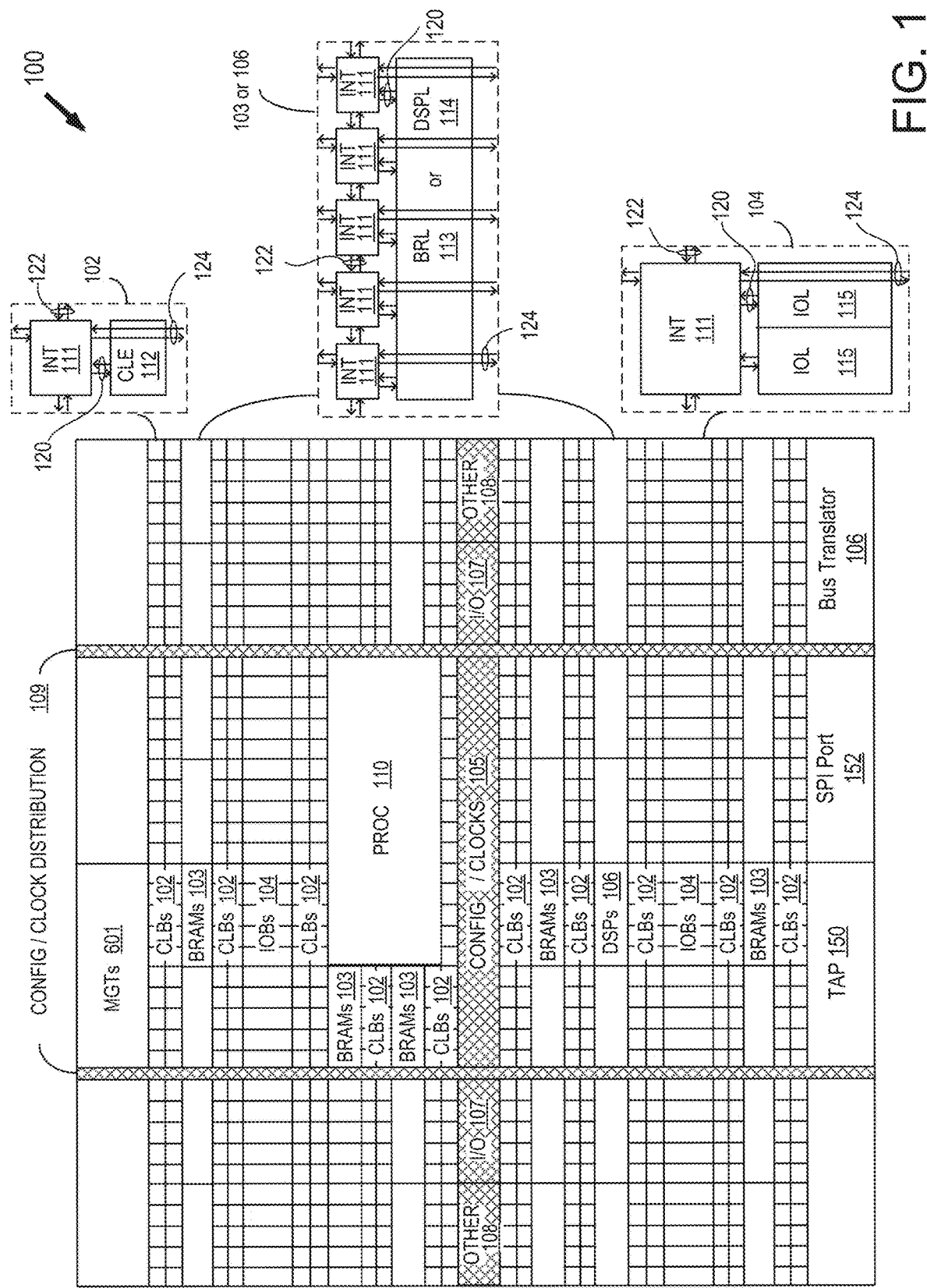
FIG. 1 is a block diagram illustrating an exemplary architecture for an IC on which a radio frequency transmitter containing one or more DPD circuits may be implemented, according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction of coefficient configurations in a DPD circuit is provided to further understanding. A DPD circuit employs various frequency selective non-linear filters to improve the linearity of transmitter power amplifiers at a radio frequency transmitter. The coefficients of the frequency selective non-linear filters are usually pre-defined and set before the DPD circuit is in operation. Some existing DPD systems utilize only the input signal power to determine from a small number of coefficient sets. However, this technique is unable to track input signals with time varying frequency content, which is a common characteristic in both modern Remote Radio Head (RRH) and Distributed Antenna System (DAS) system that employ DPD solutions.

In some DPD systems, frequency content information may be provided by a signal classifier for selecting DPD coefficients. For example, the input signal may be shifted in frequency with symmetric positive and negative translations, and the average powers of the frequency-shifted signals may be used to compute a metric referred to herein as the half-band power ratio (HBPR), which is indicative of the frequency location of signal power of the input signal, e.g., how the signal power is distributed among the frequency bandwidth of the input signal. Such HBPR is then used to map to one of many pre-defined sets of DPD coefficients, as the HBPR is usually the result of a specific carrier configuration of the input signal.

However, such DPD system may result in the same HBPR metric for symmetric carrier configurations, e.g., when the carrier used for the input signal has symmetric waveforms. In this case, the HBPR metric alone is unable to uniquely classify different carrier configurations and may lead to DPD coefficient configuration with less optimal performance for the DPD circuit.

In view of the performance issue of coefficient configurations in DPD circuits, embodiments described herein provide methods and apparatuses for improving the frequency selectivity for a signal classifier that is configured to generate both power and frequency content information as a signal classifier for DPD coefficients. By two-dimensional frequency content metrics, different carrier configurations may be uniquely characterized and thus DPD coefficient allocation can be accurately performed per different carrier configuration. Further, in some embodiments, the solution requires no external information and is waveform-agnostic, which is applicable to both RRH and DAS deployments.

Because one or more of the above-described embodiments and embodiments described throughout the application are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Figure 2:
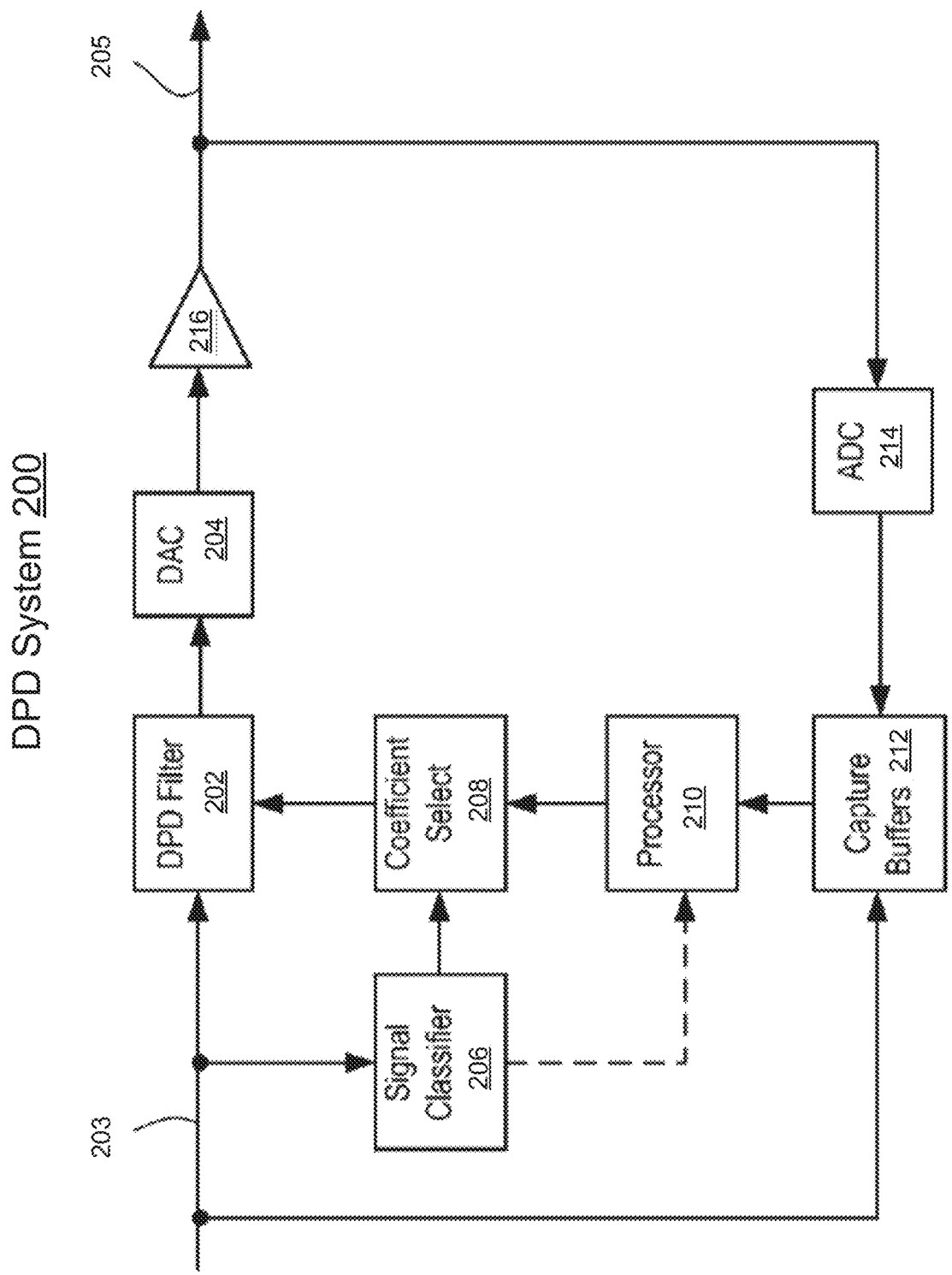
FIG. 2 is a block diagram illustrating an exemplary structure of a DPD system including a signal classifier for coefficient configuration, which may be implemented on the IC architecture shown in FIG. 1, according to some embodiments of the present disclosure.

FIG. 2 is a block diagram illustrating an exemplary structure of a DPD system including a signal classifier for coefficient configuration, which may be implemented on the IC architecture shown in FIG. 1, according to some embodiments of the present disclosure. The DPD system 200 includes a DPD filter 202, a digital-to-analog converter (DAC) 204, a power amplifier 216, a signal classifier 206, a coefficient select unit 208, a processor 210 (also referred to as a processing unit 210), capture buffers 212, and an analog-to-digital converter (ADC) 214. In some embodiments, the processor 210 may include the coefficient select unit 208 for performing the coefficient selection function. In some embodiments, the coefficient select unit 208 is a separate circuit from the processor 210. An input 203 is operable to receive an input signal, e.g., a digital signal comprising a stream of discrete digital samples (samples). An input of the DPD filter 202 is coupled to the input 203 for receiving the input signal. An output of the DPD filter 202 is coupled to an input of the DAC 204. An output of the DAC 204 is coupled to an input of the power amplifier 216. An output of the power amplifier 216 is coupled to an output 205 that provides an analog signal as output.

An input of the signal classifier 206 is coupled to the input 203 for receiving the digital signal. In an example, an output of the signal classifier 206 is coupled to a coefficient select circuit 208. An output of the coefficient select circuit 208 is coupled to another input of the DPD filter 202. In another example, an output of the signal classifier 206 is coupled to an input of the processor 210.

One input of the capture buffers 212 is coupled to the input 203, and another input of the capture buffers 212 is coupled to an output of the ADC 214. An input of the ADC 214 is coupled to the output 205 for receiving the analog signal. An output of the capture buffers 212 is coupled to an input of the processor 210. An output of the processor 210 is coupled to another input of the coefficient select circuit 208.

In operation, the DPD filter 202 is configured with a set of filter coefficients. The DPD filter 202 applies digital pre-distortion to the digital signal at the input 203. Any known filter capable of providing digital pre-distortion can be used to implement DPD filter 202. The DAC 204 converts the digital output of the DPD filter 202 to analog output, which is amplified by the power amplifier 216. The processor 210 is configured to analyze the digital signal at the input and samples of the analog signal at the output 205. The processor 210 can obtain samples of the input and output signals from the capture buffers 212. The ADC 214 is configured to sample the analog signal and store the samples in the capture buffers 212 for analysis by the processor 210. The processor 210 can use any known algorithm for generating and updating sets of coefficients that can be used by DPD filter 202 for digital pre-distortion.

The coefficient select circuit 208 can store sets of filter coefficients for the DPD filter 202. The signal classifier 206 is configured to analyze the digital signal and control the coefficient select circuit 208 to select a particular set of coefficients for the DPD filter 202 that is optimal for the digital signal. In another example, rather than directing controlling the coefficient select circuit 208, the signal classifier 206 can provide output to the processor 210, which then controls the coefficient select circuit 208 to select a particular set of filter coefficients based on the output of the signal classifier 206. As discussed further below, the signal classifier 206 selects a set of filter coefficients for use by DPD filter 202 based on an average power of the digital signal (e.g., without using frequency shift of the digital signal) and a frequency content metric. The signal classifier 206 does not depend on any particular method that the processor 210 uses to determine the sets of filter coefficients from which to select.

Figure 3:
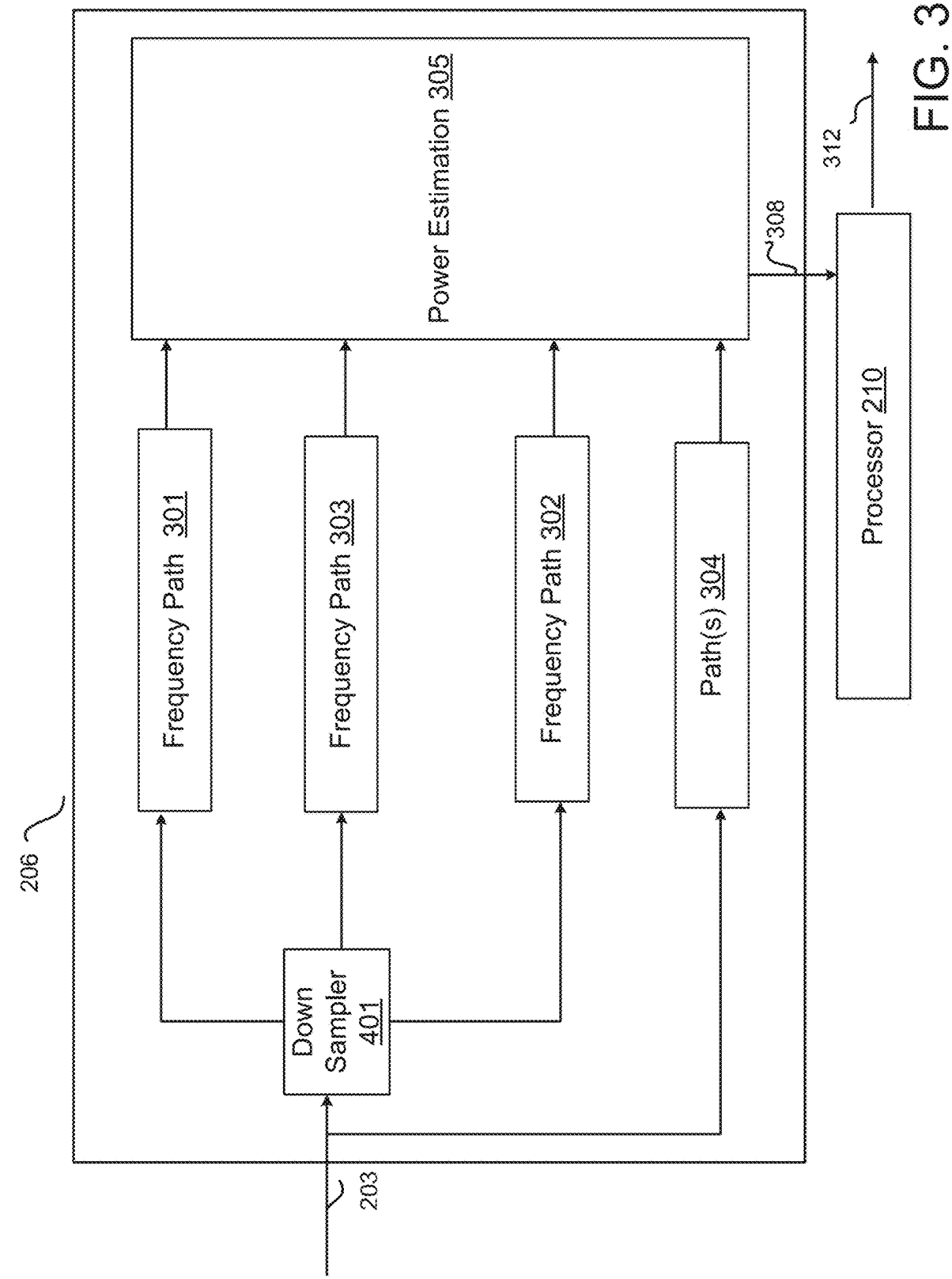
FIG. 3 is a block diagram illustrating an exemplary structure of a signal classifier for configuring a set of coefficients of the DPD system illustrated in FIG. 2, according to some embodiments of the present disclosure.

FIG. 3 is a block diagram illustrating an exemplary structure of signal classifier 206 for configuring a set of coefficients of the DPD system 200 illustrated in FIG. 2, according to some embodiments of the present disclosure. The signal classifier 206 receives and processes an input signal from input 203 and outputs power characteristics 308 relating to the input signal from input 203 to processor 210. Specifically, the signal classifier 206 includes a down sampler 401, which is configured to down sample the input signal from input 203 (e.g., by half). The down-sampled signal is then sent to multiple parallel frequency paths (e.g., frequency paths 301-303). A power estimation circuit 305 may be connected to the frequency paths 301-303 to compute power characteristics based on the output of each frequency path. In some embodiments, the power estimation circuit 305 may comprise different power meters (e.g., power meters 414, 424 and 444 of FIG. 4), each connected to a separate frequency path for estimating the average output power of the respective frequency path. Note that while three example frequency paths 301-303 are illustrated in FIG. 3, the signal classifier 206 may include any positive number of frequency paths for handling different frequency components.

In some embodiments, the signal classifier 206 includes one or more additional paths 304 that receive the input signal from the input 203, and provide output signal(s) to the power estimation 305. The additional paths 304 may include one or more frequency paths for handling different frequency components (e.g., by ±Fs/2, ±Fs/8, +Fs/16, etc. frequency shifts). The additional paths 304 may also include a path that does not include any frequency shift, for example, by sending the input signal from the input 203 to the power estimation 305 without any frequency shift.

Figure 4:
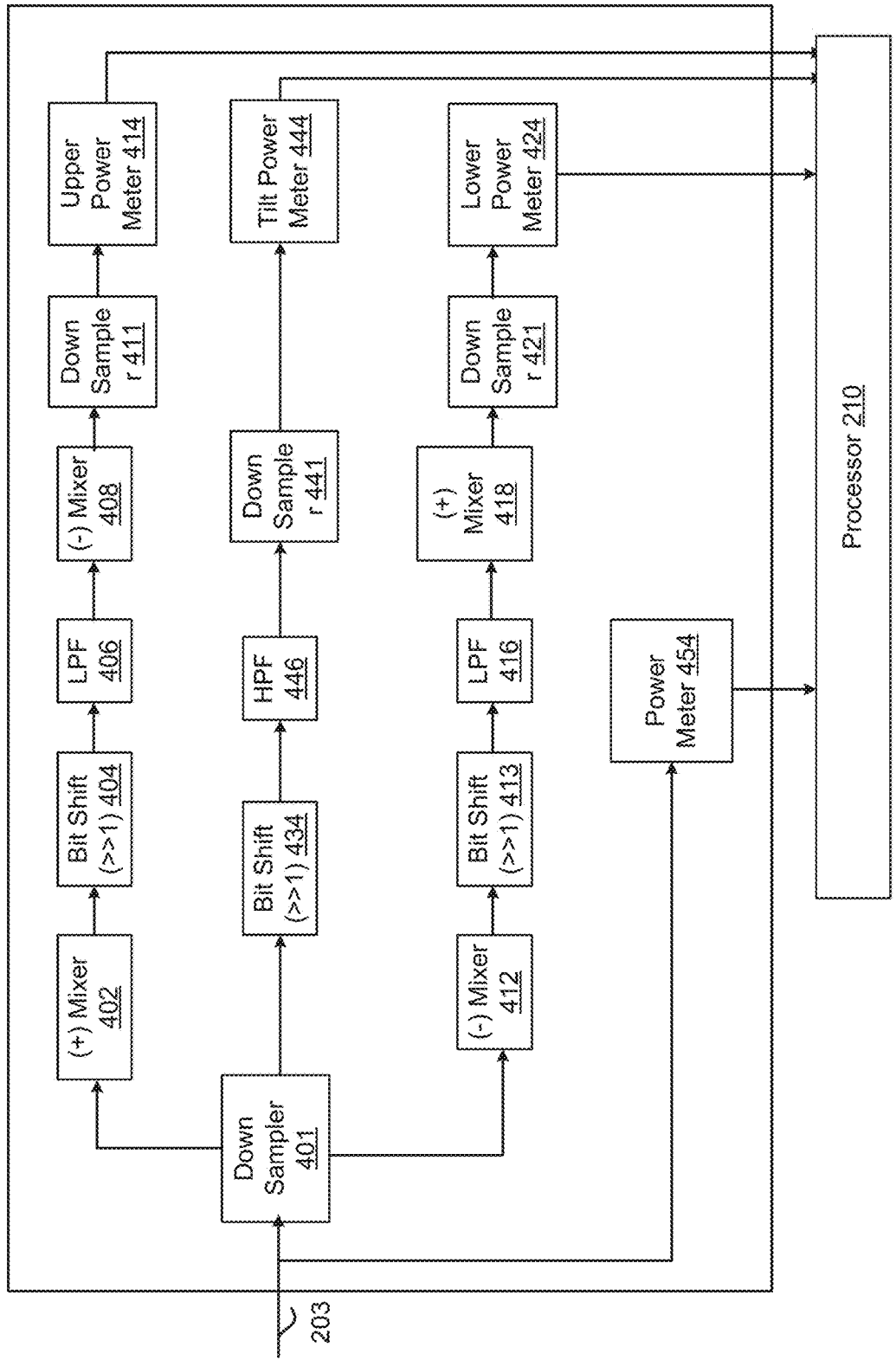
FIG. 4 is a block diagram illustrating a detailed circuit structure of the signal classifier shown in FIG. 3, according to some embodiments of the present disclosure.

FIG. 4 is a block diagram illustrating a detailed circuit structure of the signal classifier 206 shown in FIG. 3, according to some embodiments of the present disclosure. As shown in FIG. 4, after down sampling at 401, the down sampled signal is sent to a frequency path (e.g., frequency path 301 of FIG. 3, also referred to as a first frequency path 301) which includes a mixer 402 that is configured to shift the down-sampled signal in frequency, e.g., by +Fs/4, where Fs denotes the sampling frequency of the input signal. Specifically, the mixer 402 may mix the input digital samples from input signal 203 with a local oscillator signal having a frequency that is ¼ the sampling frequency (Fs). The frequency-shifted signal is then sent to the bit shifter 404 configured to right shift the digits of the signal by one bit. A first-order half-band low pass filter (LPF) 406 that is operated at half of the input sample rate of the input signal 203 is then used to passes the lower half of the spectrum of the output of the bit shifter 404, which corresponds to the negative frequencies at the input to the mixer 402. A mixer 408 is used to shift the output of the LPF back in frequency to offset the frequency shift done by mixer 402, e.g., by −Fs/4. Another down-sampler 411 may be applied to further down sample the output of the mixer 408 by half, and the output signal of the down-sampler 411 may be sent to an upper power meter 414. The upper power meter 414 thus generates an average power level of the output signal from the down-sampler 411, denoted by $P_{upper}$.

In some examples, the down sampled signal is sent to another frequency path (e.g., frequency path 302 of FIG. 3, also referred to as a second frequency path 302) in parallel, which includes a mixer 412 that is configured to shift the down-sampled signal in frequency, e.g., by −Fs/4, where Fs denotes the sampling frequency of the input signal. Specifically, the mixer 412 may mix the input digital samples from input signal 203 with a local oscillator signal having a negative frequency that is ¼ the sampling frequency (Fs). The frequency-shifted signal is then sent to the bit shifter 413 configured to right shift the digits of the signal by one bit. A first-order half-band low pass filter (LPF) 416 that is operated at half of the input sample rate of the input signal 203 is then used to pass a lower half of the spectrum of the output of the bit shifter 404, which corresponds to the positive frequencies at the input to the mixer 412. A mixer 418 is used to shift the output of the LPF back in frequency to offset the frequency shift done by mixer 412, e.g., by +Fs/4. Another down-sampler 421 may be applied to further down sample the output of the mixer 418 by half, and the output signal of the down-sampler 421 may be sent to a lower power meter 424. The lower power meter 424 thus generates an average power level of the output signal from the down-sampler 421, denoted by $P_{lower}$.

The half-band LPFs 406 and 416 can be implemented using finite impulse response filter(s), infinite impulse response filter(s), or the like. In an example, the half-band LPFs 406 and 416 can be implemented using one or more digital signal processors (DSPs).

In some examples, the down sampled signal is sent to yet another frequency path (e.g., frequency path 303 of FIG. 3, also referred to as a third frequency path 303) in parallel, which includes a bit shifter 434 that right shifts the down-sampled signal by one bit. The shifted signal is then sent to a first-order high pass filter (HPF) 446, configured to pass the upper half of the spectrum of the output of the bit shifter 434. A down-sampler 441 is configured to down sample the output of the HPF by half. In this way, the output of the down-sampler 441 is measured by a tilt power meter 444 to generate an average power level indicative of the average power of frequency components close to zero, denoted by Pvt.

The generated power levels 308 from respective paths (e.g., frequency paths 301, 302, 303, path(s) 304) may then be sent to the processor 210, which in turn computes frequency content metrics including the HBPR. In some examples, frequency content metrics include the HBPR, which is computed as:

$(P_{upper}-P_{lower})/(P_{upper}+P_{lower})$.

In some examples, the frequency content metrics include a bandwidth metric indicative of an instantaneous bandwidth (e.g., how far apart are the highest frequency and the lowest frequency that active carriers correspond to) of the input signal 203, for example, computed as:

$2 \times P_{tilt}/(P_{upper}+P_{lower})$.

In some embodiments, the input signal from the input 203 is sent to yet one or more paths (e.g., path(s) 304 of FIG. 3). In the example of FIG. 4, the additional paths 304 include a path that does not include any frequency shift, and sends the input signal from the input 203 to a power meter 454 of the power estimation 305 without any frequency shift. The power meter 455 may generate an average power level indicative of the average power of the input signal from the input 204, and send that average power level output signal to the processor 210.

The processor 210 may use the two-dimensional frequency content metrics HBPR, and the bandwidth metric to jointly map to a set of DPD coefficients, e.g., by sending the HBPR metric and the bandwidth metric to the coefficient select circuit 208. The coefficient select circuit 208 may in turn map the combination of the HBPR metric and the bandwidth metric to a specific set of DPD coefficients from a number of pre-defined coefficient sets, as further illustrated in FIGS. 9-10.

Figure 5:
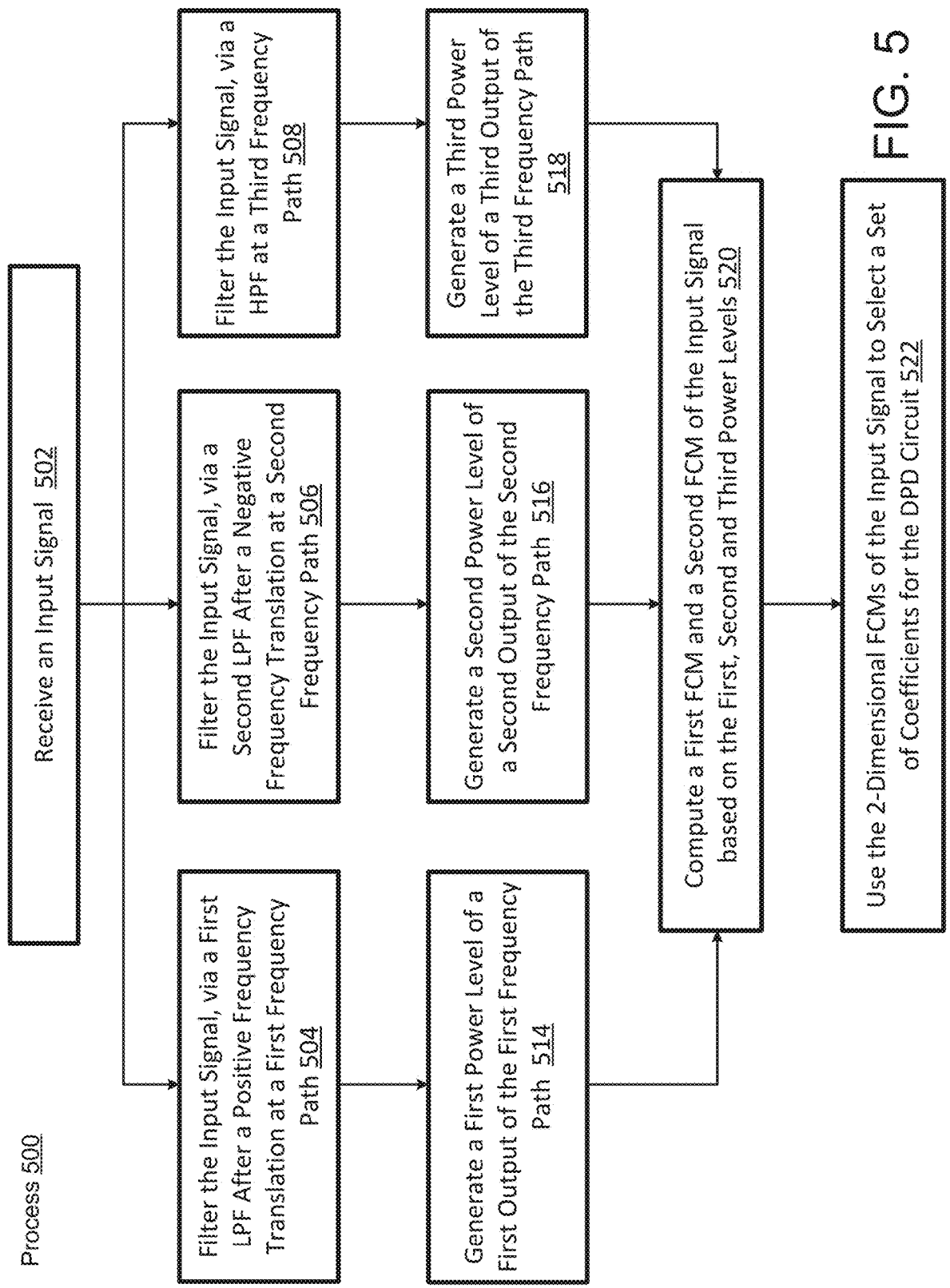
FIG. 5 is a logic flow diagram illustrating a process of generating frequency content metrics for DPD coefficient configuration using the signal classifier shown in FIGS. 3-4, according to some embodiments of the present disclosure.

FIG. 5 is a logic flow diagram illustrating a process of generating frequency content metrics for DPD coefficient configuration using the signal classifier (e.g., signal classifier of FIGS. 3 and 4), according to some embodiments of the present disclosure. Process 500 starts at step 502, where an input signal is received. For example, the input signal may be received at the signal classifier 206 in the form of digital input samples 203.

Process 500 may then proceed to steps 504, 506 and 508, which may occur in parallel, intermittently or concurrently. It is noted that while three example steps 504, 506, and 508 corresponding to three frequency paths (e.g., frequency paths 301, 302, and 303) are illustrated in FIG. 5, any suitable number of frequency paths and/or other paths (with or without frequency shift) may be used. At step 504, the input signal is filtered via a first half-band LPF, e.g., LPF 406 in FIG. 4, after a positive frequency translation, e.g., via mixer 402 in FIG. 4, at a first frequency path. At step 514, a first power level corresponding to a signal output of the first frequency path is generated. For example, the average power level of the output signal of the down-sampler 411 may be captured by the upper power meter 414 in FIG. 4.

At step 506, the input signal may be filtered via a second half-band LPF, e.g., LPF 416 in FIG. 4, after a negative frequency translation, e.g., via mixer 412 in FIG. 4, at a second frequency path. At step 516, a second power level corresponding to a signal output of the second frequency path is computed. For example, the average power level of the output signal of the down-sampler 421 may be captured by the lower power meter 424 in FIG. 4.

At step 508, the input signal may be filtered via a HPF (e.g., HPF 446 in FIG. 4) at a third frequency path. At step 518, a third power level corresponding to a signal output of the third frequency path is generated. For example, the average power level of the output signal of the down-sampler 441 may be captured by the tilt power meter 444 in FIG. 4.

At step 520, frequency content metrics corresponding to the input signal based on the first power level, the second power level and the third power level for selecting a set of DPD coefficients for the DPD circuit may be computed. For example, as discussed in relation to FIG. 4, the HBPR metric and the bandwidth metric may be computed based on $P_{upper}$, $P_{lower}$ and $P_{tilt}$.

At step 522, the two-dimensional frequency content metrics, e.g., the HBPR metric and the bandwidth metric, may be used to map to a set of DPD coefficients. For example, a number of coefficient sets may be pre-mapped to each carrier configuration for the input signal based on empirical data (e.g., history data). The two-dimensional frequency content metrics may be used as a signal classifier that uniquely maps to a specific carrier configuration for the input signal, and in turn corresponds to a unique set of DPD coefficient.

Figure 6:
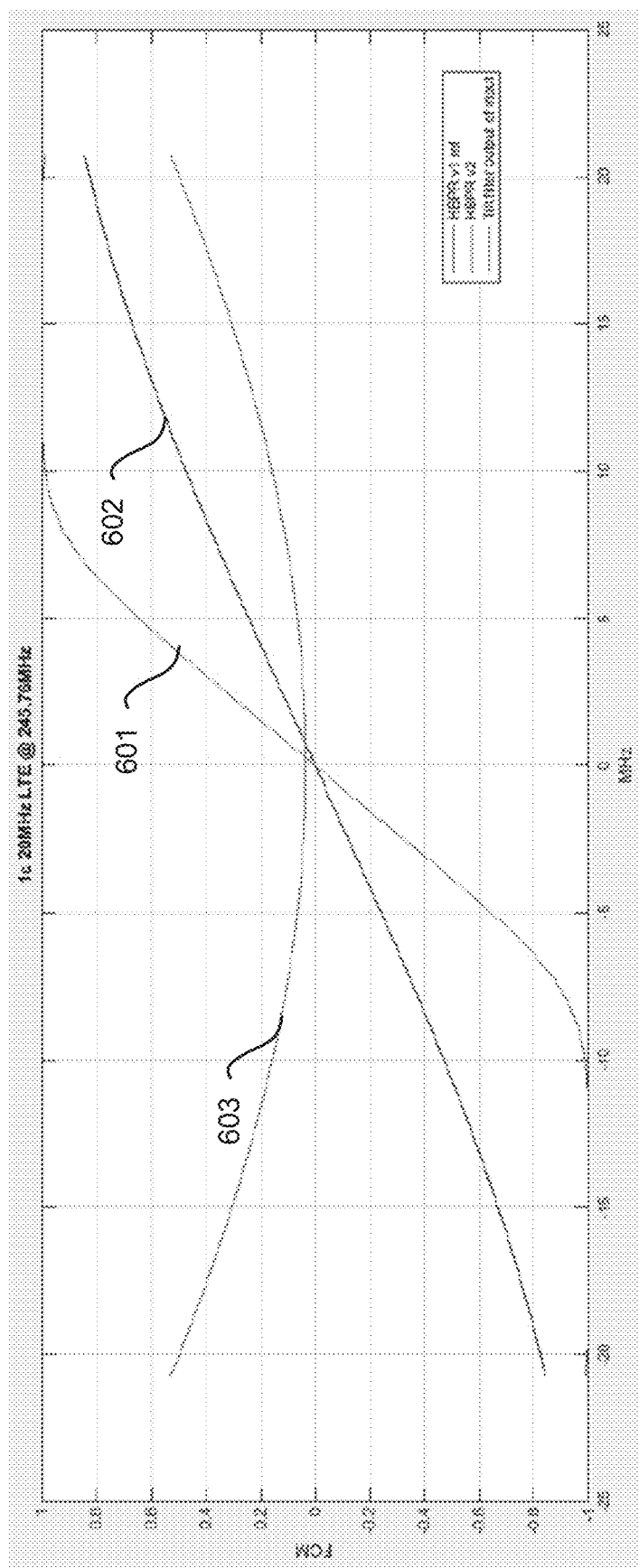
FIG. 6 is a diagram comparing several frequency content metrics generated across the input bandwidth of the input signal, according to some embodiments of the present disclosure.

FIG. 6 is a diagram comparing several frequency content metrics generated across the input bandwidth of the input signal, according to some embodiments of the present disclosure. Plot 601 shows the HBPR metric computed using an example circuit that produces a single HBPR metric, where the example circuit utilizes a higher order half-band filter that produces a step function in the single HBPR metric when a single carrier of 20 MHz LTE signal is swept across the input bandwidth. Plots 602 and 603 illustrate the multiple metrics computed using the example circuits of FIGS. 3 and 4. For example, plot 602 shows the HBPR metric computed using the first frequency path 301 and the second frequency path 302 shown in FIG. 3 (and FIG. 4) based on first-order LPFs 406 and 416 in FIG. 4, which produce a more linear response. Plot 603 shows the bandwidth metric computed using a first-order HPF 446 at the third frequency path 303 shown in FIGS. 3 and 4, which is related to the instantaneous bandwidth of the input signal.

Figure 7:
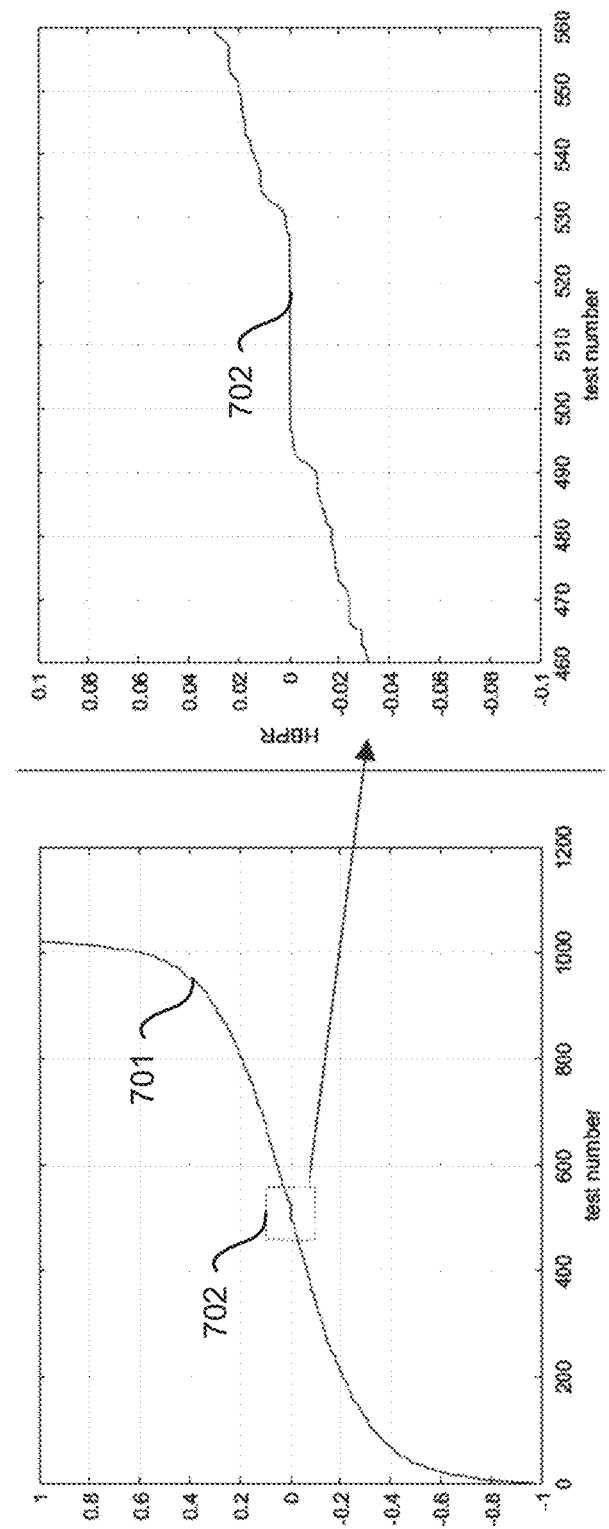
FIG. 7 is a diagram illustrating an example frequency content metric, the half-band power ratio (HBPR) under different carrier configurations of the input signal, according to some embodiments of the present disclosure.

FIG. 7 is a diagram illustrating an example frequency content metric, the half-band power ratio (HBPR) under different carrier configurations of the input signal, according to some embodiments of the present disclosure. Specifically, plot 701 shows the HBPR metric computed using the example circuit for plot 601, which uses higher order half-band filter that produced somewhat of a step function in the HBPR when a single carrier is swept across the band. In this example, when the HBPR metric is used by itself to characterize the carrier configuration for the input signal, such mapping may not be able to uniquely identify certain carrier configurations because carrier configurations with symmetric carrier loading will produce the same HBPR metric. For example, a 200 MHz system with ten 20 MHz carriers may have 1023 different active carrier configurations. When all 1023 carrier configuration waveforms are passed through the signal classifier to generate the HBPR metric, some carrier waveforms may correspond to HBPR metrics that are substantially close to zero, e.g., as shown at section 702 of the plot 701.

The carrier configurations used in tests corresponding to the almost-zero HBPR values shown in section 702 of the plot 701 have symmetric active carriers (as indicated by a '1' in the active carrier mask). Example symmetric active carrier configurations are provided in the following table:

TABLE 1

Example Symmetric Active Carriers

|  | Symmetric Carriers |
| --- | --- |
| Carrier Configuration #1 (two active carriers) | 0000110000 |
|  | 0001001000 |
|  | 0010000100 |
|  | 0100000010 |
|  | 1000000001 |
| Carrier Configuration #2 (four active carriers) | 0001111000 |
|  | 0010110100 |
|  | 0011001100 |
|  | 0100110010 |
|  | 0101001010 |
|  | 0110000110 |
|  | 1000110001 |
|  | 1001001001 |
|  | 1010000101 |
|  | 1100000011 |
| Carrier Configuration #3 (six active carriers) | 0011111100 |
|  | 0101111010 |
|  | 0110110110 |
|  | 0111001110 |
|  | 1001111001 |
|  | 1010110101 |
|  | 1011001101 |
|  | 1100110011 |
|  | 1101001011 |
|  | 1110000111 |
| Carrier Configuration #4 (eight active carriers) | 0111111110 |
|  | 1011111101 |
|  | 1101111011 |
|  | 1110110111 |
|  | 1111001111 |
| Carrier Configuration #5 (ten active carriers) | 1111111111 |

Symmetric carrier configuration cases with the same number of active carriers also have the same average power. Thus, when only the HBPR metric, together with the average input power without utilizing frequency shift, is used as the signal classifier, the same metrics may be produced for different carrier configurations, which may fail to uniquely classify the input signal carrier configuration and thus fail to map to the unique optimal set of DPD coefficients for the input signal.

Those issues are eliminated/reduced by the example of FIGS. 3-5. By augmenting the HBPR metric with the bandwidth metric, as shown in FIGS. 3-5, the two-dimensional metrics can better distinguish between the symmetric carrier cases. Specifically, when the DPD circuit switches between two waveforms with highly different instantaneous bandwidths (e.g. carriers [0000110000] and [1000000001], which may be associated with the same HBPR metric), the two waveforms can be uniquely classified by a combination of the same HBPR metrics and the different bandwidth metrics, and thus be allocated to different sets of DPD coefficients to ensure DPD performance stability.

Figure 8:
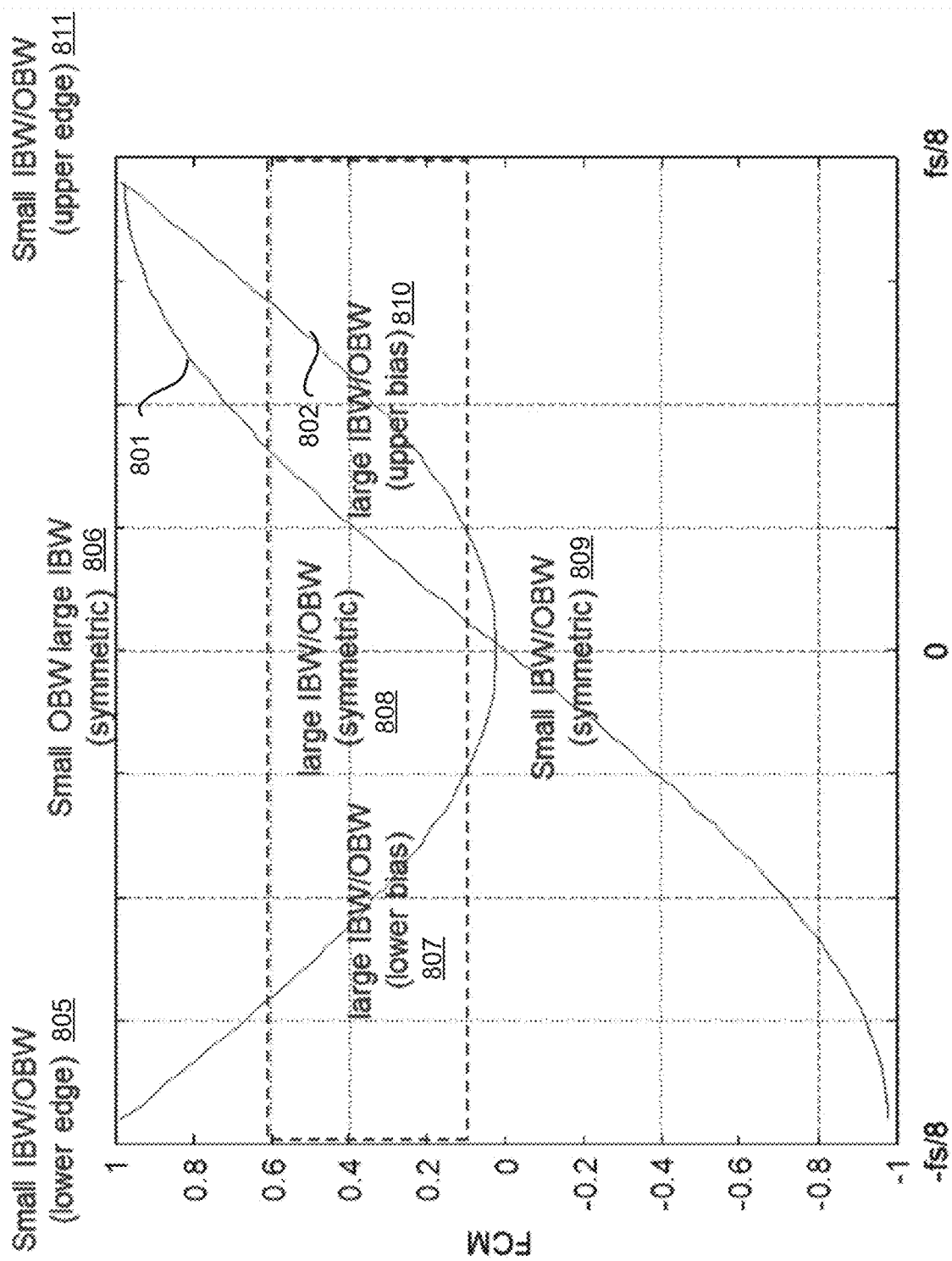
FIG. 8 is a diagram illustrating the frequency content metrics generated by the signal classifier shown in FIGS. 3-4 and the corresponding characteristics of the input carrier configuration, according to some embodiments of the present disclosure.

FIG. 8 is a diagram illustrating the frequency content metrics generated by the signal classifier of FIGS. 3-4 and the corresponding characteristics of the input carrier configuration, according to some embodiments of the present disclosure. As shown in FIG. 8, the combination of the HBPR metric as shown at plot 801 and the bandwidth metric as shown at plot 802 indicate characteristics such as the instantaneous bandwidth (referred to as IBW in FIG. 8) and the occupied bandwidth (referred to as OBW in FIG. 8) of the corresponding carrier configuration. Specifically, the IBW indicates how far apart the highest frequency and the lowest frequency associated with the carriers of the current carrier configuration and the OBW indicates how much of the total bandwidth is occupied by the configured carriers.

Thus, when the bandwidth metric is at the maximum, and the HBPR metric is at the (negative) minimum, $P_{upper}$ and $P_{lower}$ may be far apart, and $P_{tilt}$ is relatively large, which corresponds to a carrier configuration case having small IBW and OBW, e.g., shown at 805. When the bandwidth metric decreases, and the absolute value of the HBPR metric decreases but remains negative, the carrier configuration may have a larger IBW and OBW, e.g., shown at 806. When the bandwidth metric is close to zero, e.g., at 806, 808 and 809, various symmetric carrier configurations may be indicated. At 810, a carrier configuration with upper bias corresponding to a large IBW and OBW may be indicated, and at 811, a carrier configuration with a small IBW and OBW may be classified.

Figure 9:
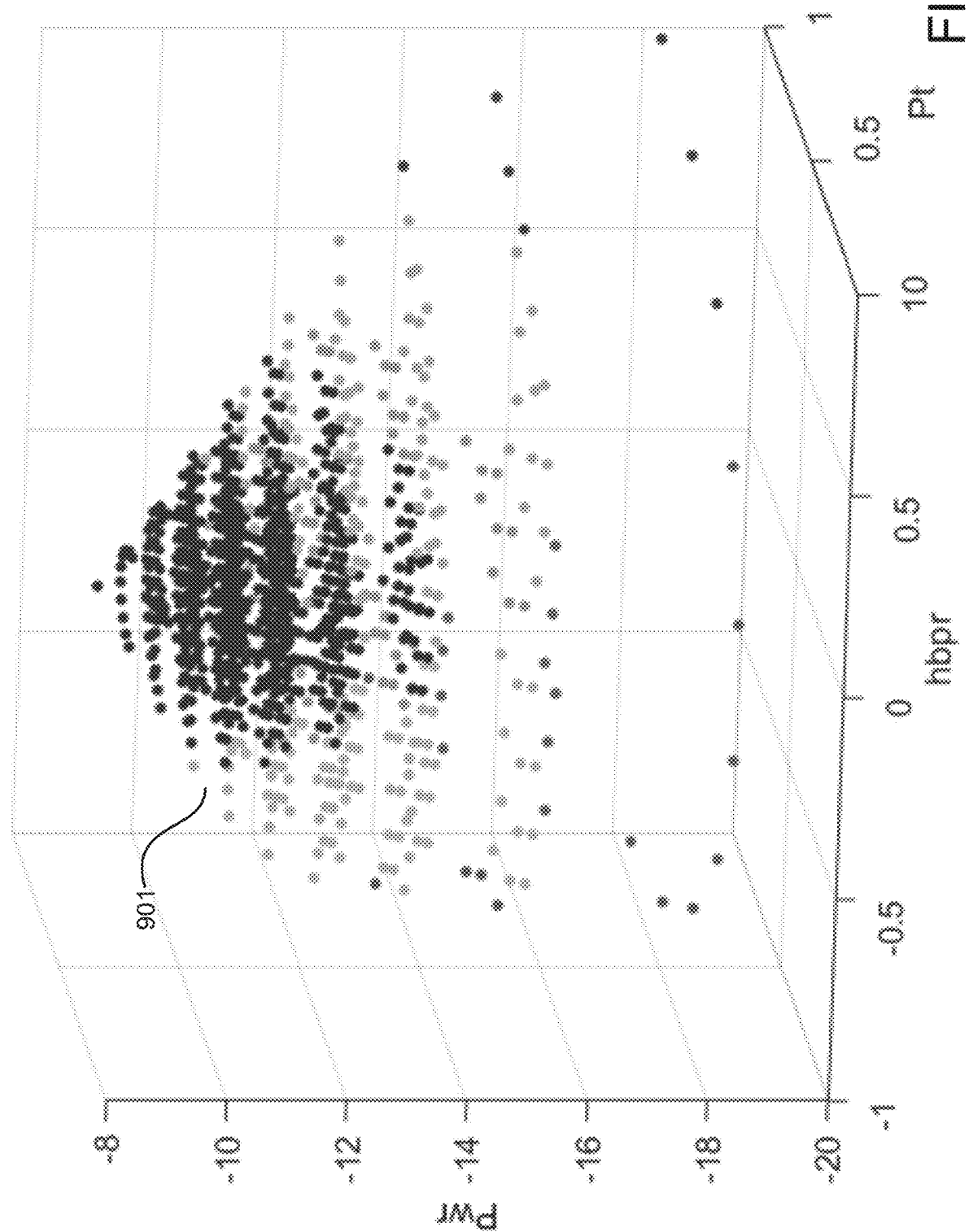
FIG. 9 is a diagram illustrating a three-dimensional mapping between frequency content metrics and power parameter of the input signal to sets of DPD coefficients, according to some embodiments of the present disclosure.

FIG. 9 is a diagram illustrating a three-dimensional mapping between frequency content metrics and power parameter of the input signal to sets of DPD coefficients, according to some embodiments of the present disclosure. A plurality of coefficient sets may be pre-defined and indexed, each associated with a coefficient set number. The two-dimensional frequency content metric, e.g., a combination of the HBPR metric and the bandwidth metric, along with the corresponding average power of the input signal (e.g., based on the input signal through path 304 without frequency shift) can be mapped into a coefficient set number. For example, if the DPD system is known to have a fixed number of carrier configurations, for each carrier configuration, the optimal set of DPD coefficients may be determined by comparing resulting DPD performance for different sets of DPD coefficients. In this way, the two-dimensional frequency content metric and the average power of the input signal corresponding to the optimal set of DPD coefficients under the specific carrier configuration may be stored as a reference point. Thus, a mapping relationship between the two-dimensional frequency content metric and the average power of the input signal and the optimal set of DPD coefficients may be established.

As shown in FIG. 9, each reference point 901 in the data plot represents a coefficient set index that is mapped to in the three-dimensional space, based on the three-dimensional coordinates, e.g., the HBPR metric, the bandwidth metric and the input power (e.g., an average power of the input signal without using frequency shift). Thus, when the HBPR metric, the bandwidth metric and the input power can be measured by the signal classifier 206 shown in FIGS. 2-4, the measured values can form a set of three-dimensional coordinates that is used to map to a data point in the three-dimensional space shown in FIG. 9, which represents a unique set of coefficients. In this way, the coefficient select circuit 208 can configure the DPD coefficients for the DPD filter 202.

Figure 10:
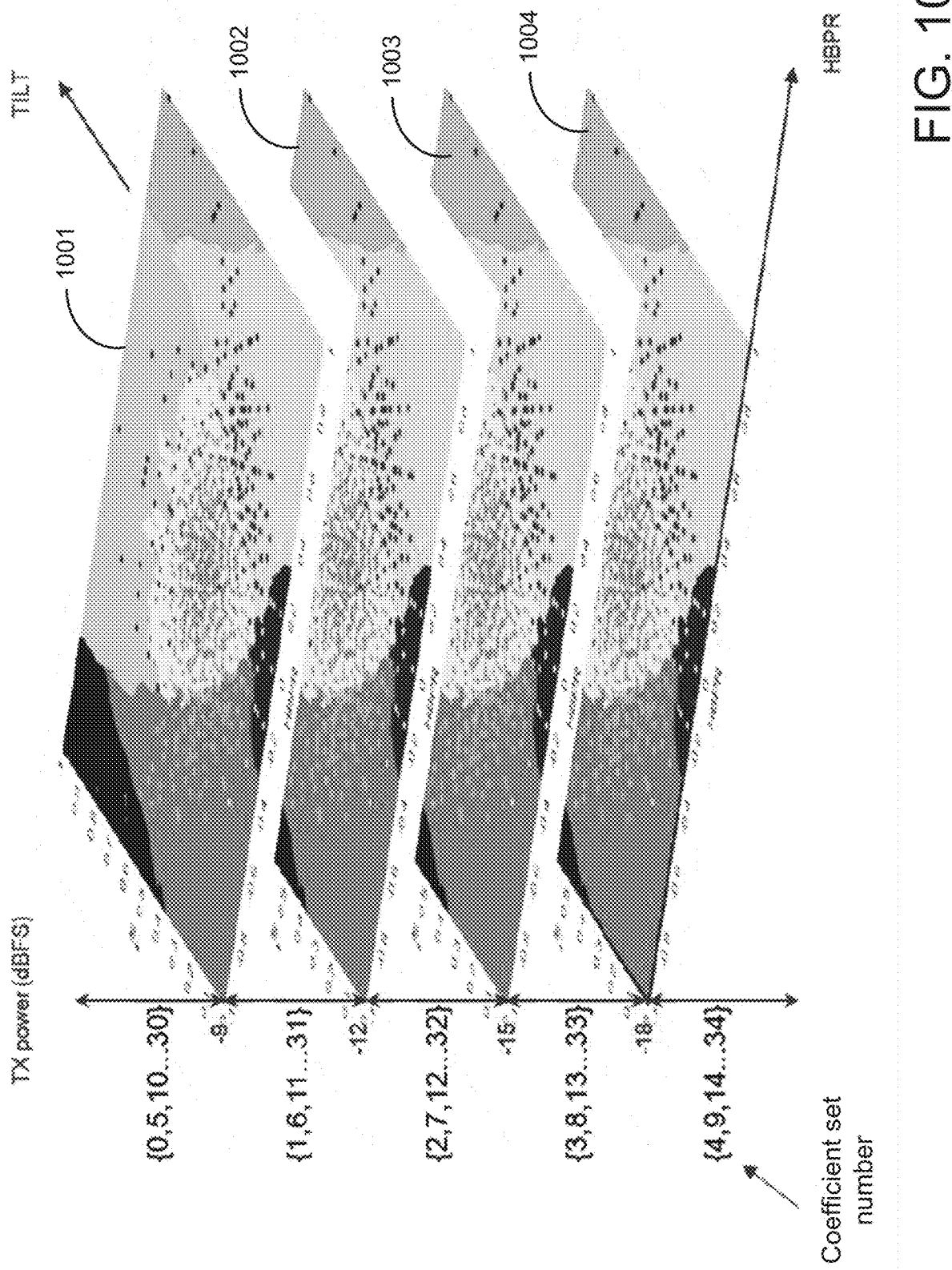
FIG. 10 is a diagram illustrating a mapping between the two-dimensional frequency content metrics and sets of DPD coefficients at different input power levels, according to some embodiments of the present disclosure.

Alternatively, the two-dimensional frequency content metric can be used to map to a set of DPD coefficients, independently from the average input power. FIG. 10 is a diagram illustrating a mapping between the two-dimensional frequency content metrics and sets of DPD coefficients at different input power levels, according to some embodiments of the present disclosure. Specifically, a number of sets of DPD coefficients are allocated to different input power levels. For example, one or more coefficient set numbers representing the one or more sets of DPD coefficients that may achieve superior performance at a specific input power level may be pre-defined as optimal for the specific power level based on empirical data (e.g., history data) or simulation, e.g., as shown by the coefficient set numbers 1008. The two-dimensional planar slices 1001-1004 illustrate the distributions of data points, each representing the optimal set of DPD coefficients selected from the one or more sets of DPD coefficients associated with the respective input power, within the two-dimensional space of HBPR metric and the bandwidth metric. Thus, when the HBPR metric and the bandwidth metric can be measured by the signal classifier 206 shown in FIGS. 2-4, the measured values can form a set of two-dimensional coordinates that may be used to map to a data point in each of the sliced 1001-1004. The mapped data point within each of the slice 901-904 represents a unique set of coefficients to be used under the respective input power level.

It is noted that various configurations illustrated in FIGS. 1-10 are exemplary only and not intended to be limiting beyond what is specifically recited in the claims that follow. It will be understood by those skilled in the art that other configurations may be used. One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device. The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An apparatus for signal classification in a digital pre-distortion (DPD) circuit, comprising:
   a first frequency path configured to filter an input signal via a first half-band low pass filter (LPF) after a positive frequency translation and to generate a first power level corresponding to a signal output of the first frequency path;

a second frequency path configured to filter the input signal via a second half-band LPF after a negative frequency translation and to generate a second power level corresponding to a signal output of the second frequency path;

a third frequency path configured to filter the input signal via a high pass filter (HPF) and to generate a third power level corresponding to a signal output of the third frequency path; and a processing unit configured to compute frequency content metrics corresponding to the input signal based on the first power level, the second power level and the third power level for selecting a set of DPD coefficients for the DPD circuit.

2. The apparatus of claim 1, wherein the third frequency path comprises:
a bit shifter that right shifts the input signal by one bit;
the HPF connected to the bit shifter and configured to filter a bit shifter output; and
a down sampler connected to the HPF and configured to down sample a HPF output.

3. The apparatus of claim 2, wherein the down sampler is connected to a power meter configured to estimate the third power level as an average output signal power from the down sampler.

4. The apparatus of claim 1, wherein the frequency content metrics include a half-band power ratio that indicates a frequency location of a signal power of the input signal and a bandwidth metric that is indicative of an instantaneous bandwidth of the signal power of the input signal.

5. The apparatus of claim 4, wherein the processing unit is configured to computing the half-band power ratio based on (the first power level−the second power level)/(the first power level+the second power level).

6. The apparatus of claim 4, wherein the processing unit is configured to compute the bandwidth metric based on 2×the third power level/(the first power level+the second power level).

7. The apparatus of claim 4, wherein the half-band power ratio and the bandwidth metric jointly classify a unique carrier configuration when the input signal belongs to a set of symmetric carrier configurations.

8. The apparatus of claim 4, wherein the processing unit is configured to map a combination of the half-band power ratio, the bandwidth metric and an average power of the input signal to the set of DPD coefficients in a three-dimensional space.

9. The apparatus of claim 8, wherein the three-dimensional space contains data points representing different sets of DPD coefficients corresponding to different carrier configurations.

10. The apparatus of claim 4, wherein the processing unit is configured to:
map an average power of the input signal to a pre-defined two-dimensional distribution landscape of DPD coefficients; and
map a combination of the half-band power ratio and the bandwidth metric to the set of DPD coefficients within the pre-defined two-dimensional distribution landscape of DPD coefficients.

11. A method for signal classification in a digital pre-distortion (DPD) circuit, comprising:
receiving an input signal;
filtering the input signal, via a first half-band low pass filter (LPF) after a positive frequency translation at a first frequency path;
generating a first power level corresponding to a signal output of the first frequency path;
filtering the input signal, via a second half-band LPF after a negative frequency translation at a second frequency path;
generating a second power level corresponding to a signal output of the second frequency path;
filtering the input signal, via a high pass filter (HPF) at a third frequency path;
generating a third power level corresponding to a signal output of the third frequency path; and
computing frequency content metrics corresponding to the input signal based on the first power level, the second power level and the third power level for selecting a set of DPD coefficients for the DPD circuit.

12. The method of claim 11, further comprising: wherein the third frequency path comprises:
right shifting, via a bit shifter at the third frequency path, the input signal by one bit;
filtering a bit shifter output by the HPF connected to the bit shifter; and
down sampling a HPF output via a down sampler connected to the HPF.

13. The method of claim 12, wherein the down sampler is connected to a power meter configured to estimate the third power level as an average output signal power from the down sampler.

14. The method of claim 11, wherein the frequency content metrics include a half-band power ratio that indicates a frequency location of the signal power of the input signal and a bandwidth metric that is indicative of an instantaneous bandwidth of the signal power of the input signal.

15. The method of claim 14, wherein the computing frequency content metrics corresponding to the input signal further comprises computing the half-band power ratio based on (the first power level−the second power level)/(the first power level+the second power level).

16. The method of claim 14, wherein the computing frequency content metrics corresponding to the input signal further comprises computing the bandwidth metric based on 2×the third power level/(the first power level+the second power level).

17. The method of claim 14, wherein the half-band power ratio and the bandwidth metric jointly classify a unique carrier configuration when the input signal belongs to a set of symmetric carrier configurations.

18. The method of claim 14, wherein the selecting the set of DPD coefficients for the DPD circuit further comprises mapping a combination of the half-band power ratio, the bandwidth metric and an average power of the input signal to the set of DPD coefficients in a three-dimensional space.

19. The method of claim 18, further comprising:
collecting data points within the three-dimensional space representing different sets of DPD coefficients corresponding to different carrier configurations.

20. The method of claim 14, wherein the selecting the set of DPD coefficients for the DPD circuit further comprises:
mapping an average power of the input signal to a pre-defined two-dimensional distribution landscape of DPD coefficients; and
mapping a combination of the half-band power ratio and the bandwidth metric to the set of DPD coefficients within the pre-defined two-dimensional distribution landscape of DPD coefficients.

* * * * *